United States Patent
Peng et al.

(10) Patent No.: US 9,793,211 B2
(45) Date of Patent: Oct. 17, 2017

(54) DUAL POWER STRUCTURE WITH CONNECTION PINS

(71) Applicant: Taiwan Semiconductor Manufacturing Co., Ltd., Hsin-Chu (TW)

(72) Inventors: Shih-Wei Peng, Hsinchu (TW); Chih-Ming Lai, Hsinchu (TW); Chun-Kuang Chen, Guanxi Township (TW); Chih-Liang Chen, Hsinchu (TW); Charles Chew-Yuen Young, Cupertino, CA (US); Jiann-Tyng Tzeng, Hsin Chu (TW); Kam-Tou Sio, Zhubei (TW); Ru-Gun Liu, Zhubei (TW); Yung-Sung Yen, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/213,486

(22) Filed: Jul. 19, 2016

(65) Prior Publication Data

US 2017/0110405 A1    Apr. 20, 2017

Related U.S. Application Data

(60) Provisional application No. 62/243,872, filed on Oct. 20, 2015.

(51) Int. Cl.
*H01L 23/538*    (2006.01)
*H01L 23/528*    (2006.01)
(Continued)

(52) U.S. Cl.
CPC .... *H01L 23/5286* (2013.01); *H01L 21/76816* (2013.01); *H01L 21/76892* (2013.01); *H01L 23/5226* (2013.01)

(58) Field of Classification Search
CPC ......... H01L 21/76816; H01L 21/76892; H01L 23/5226; H01L 23/528; H01L 23/5386; H01L 27/11504
See application file for complete search history.

(56) References Cited

U.S. PATENT DOCUMENTS

2007/0096154 A1* 5/2007 Shimbo ............... H01L 27/0207
257/207
2007/0241810 A1* 10/2007 Onda ................... G11C 11/4074
327/544

(Continued)

FOREIGN PATENT DOCUMENTS

TW         201507159 A    2/2015

*Primary Examiner* — Bitew Dinke
(74) *Attorney, Agent, or Firm* — Eschweiler & Potashnik, LLC (57) ABSTRACT

The present disclosure relates to an integrated chip having a dual power rail structure. In some embodiments, the integrated chip has a first metal interconnect layer having a lower metal wire extending in a first direction. A second metal interconnect layer has a plurality of connection pins coupled to the lower metal wire by way of a first via layer and extending over the lower metal wire in a second direction perpendicular to the first direction. A third metal interconnect layer has an upper metal wire extending over the lower metal wire and the connection pins in the first direction. The upper metal wire is coupled to the connection pins by way of a second via layer arranged over the first via layer. Connecting the connection pins to the lower and upper metal wires reduces current density in connections to the connection pins, thereby reducing electromigration and/or IR issues.

20 Claims, 9 Drawing Sheets

(51) Int. Cl.
*H01L 23/522* (2006.01)
*H01L 21/768* (2006.01)

(56) References Cited

U.S. PATENT DOCUMENTS

| | | | | |
|---|---|---|---|---|
| 2007/0278528 A1* | 12/2007 | Ato | ............... | H01L 27/0207 257/207 |
| 2009/0039520 A1* | 2/2009 | Tanaka | ............... | G06F 17/5077 257/773 |
| 2009/0212837 A1 | 8/2009 | Katoh | | |
| 2009/0237186 A1* | 9/2009 | Onda | ............... | H01P 3/003 333/238 |
| 2011/0157965 A1* | 6/2011 | Nii | ............... | G11C 11/4125 365/156 |
| 2011/0254066 A1* | 10/2011 | Miura | ............... | H01L 27/0207 257/296 |
| 2012/0280287 A1* | 11/2012 | Hou | ............... | H01L 27/0207 257/288 |
| 2013/0026580 A1* | 1/2013 | Morimoto | ............... | H01L 27/0207 257/369 |
| 2013/0258749 A1* | 10/2013 | Liaw | ............... | G11C 5/06 365/104 |
| 2013/0258759 A1* | 10/2013 | Liaw | ............... | G11C 11/412 365/154 |
| 2013/0272056 A1* | 10/2013 | Liaw | ............... | G11C 8/14 365/154 |
| 2014/0035056 A1* | 2/2014 | Liaw | ............... | G11C 11/412 257/369 |
| 2014/0246791 A1 | 9/2014 | Stephens et al. | | |
| 2015/0014775 A1* | 1/2015 | Seo | ............... | H01L 23/5286 257/351 |
| 2015/0016173 A1* | 1/2015 | Liaw | ............... | G11C 17/08 365/72 |
| 2015/0357282 A1* | 12/2015 | Lau | ............... | H01L 23/5226 257/401 |
| 2016/0056083 A1* | 2/2016 | Do | ............... | H01L 21/82343 438/299 |
| 2016/0240539 A1* | 8/2016 | Mojumder | ............... | G11C 8/14 |
| 2016/0268243 A1* | 9/2016 | Lee | ............... | H01L 27/092 |
| 2016/0300826 A1* | 10/2016 | Lee | ............... | H01L 27/0207 |

* cited by examiner

DUAL POWER STRUCTURE WITH CONNECTION PINS

REFERENCE TO RELATED APPLICATION

This Application claims priority to U.S. Application No. 62/243,872 filed on Oct. 20, 2015. The contents of which is hereby incorporated by reference in its entirety

BACKGROUND

Over the last four decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern day integrated chips may comprise millions or billions of semiconductor devices arranged on a single semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips comprise power rails, which are metal interconnect wires arranged within a back-end-of-the-line (BEOL) and configured to provide a voltage potential to a plurality of transistor devices on an integrated chip. For example, integrated chips often comprise a first power rail held at a source voltage potential ($V_{SS}$) and a second power rail held at a ground voltage potential ($V_{DD}$). Typically, power rails may run on a first metal interconnect wire (e.g., a "M1" layer). However, as the size of integrated chips decreases, the size of such power rails also decreases. It has been appreciated that in emerging technology nodes (e.g., 14 nm, 10 nm, 7 nm, 5 nm, etc.) the small size of such power rails may lead to a high current density within the power rails. The high current density can lead to reliability concerns such as larger electro-migration and/or IR issues (due to a higher resistance of the smaller metal interconnect wires).

The present disclosure relates to an integrated chip having a dual power rail structure configured to reduce current density. In some embodiments, the integrated chip comprises a first metal interconnect layer comprising a lower metal wire extending in a first direction. A second metal interconnect layer comprises a plurality of connection pins coupled to the lower metal wire by way of a first via layer and extending over the lower metal wire in a second direction perpendicular to the first direction. A third metal interconnect layer comprises an upper metal wire extending over the lower metal wire and the plurality of connection pins. The upper metal wire is coupled to the plurality of connection pins by way of a second via layer arranged over the first via layer. By connecting the plurality of connection pins to the lower metal wire and the upper metal wire, current density in connections to the connection pins is reduced, thereby reducing electro-migration and/or IR issues.

Figure 1:
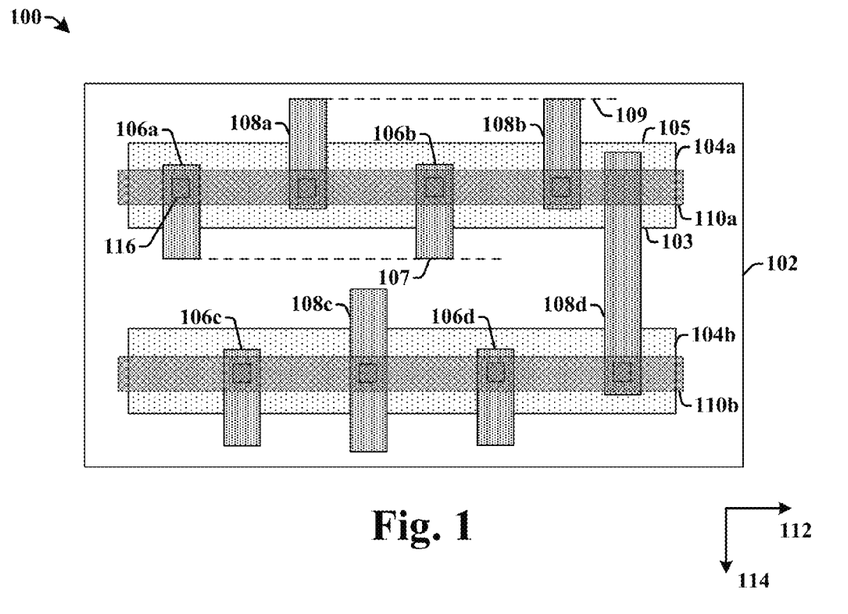
FIG. 1 illustrates a top-view of some embodiments of an integrated chip having a plurality of connection pins arranged between overlying and underlying metal wires.

FIG. 1 illustrates a top-view of some embodiments of an integrated chip 100 having a plurality of connection pins arranged between overlying and underlying metal wires.

The integrated chip 100 comprises a first metal interconnect layer 104 extending in a first direction 112 over a semiconductor substrate 102. The first metal interconnect layer 104 comprises a first lower metal wire 104a, and a second lower metal wire 104b arranged in parallel to the first lower metal wire 104a. A second metal interconnect layer (comprising 106 and 108) overlies the first metal interconnect layer 104. A third metal interconnect layer 110 overlies the second metal interconnect layer and comprises a first upper metal wire 110a overlying the first lower metal wire 104a, and a second upper metal wire 110b overlying the second lower metal wire 104b.

The second metal interconnect layer comprises a plurality of connection pins, 106 and 108, that extend in a second direction 114 that is perpendicular to the first direction 112. The plurality of connection pins, 106 and 108, are vertically arranged between the first metal interconnect layer 104 and the third metal interconnect layer 110. The plurality of connections pins, 106 and 108, are electrically coupled to the first metal interconnect layer 104 by way of a first set of conductive vias arranged below the plurality of connection pins, 106 and 108, (below illustrated conductive vias 116) and to the third metal interconnect layer 110 by way of second set of conductive vias 116 arranged above the plurality of connection pins, 106 and 108. For example, the plurality of connection pins, 106 and 108, are connected to the first metal interconnect layer 104 by way of conductive vias on a first via layer and to the third metal interconnect layer 110 by way of conductive vias on a second via layer. The plurality of connection pins, 106 and 108, extend from between the first metal interconnect layer 104 and the third metal interconnect layer 110 to a position laterally offset from the first metal interconnect layer 104 and the third metal interconnect layer 110. The plurality of connection pins, 106 and 108, are configured to provide an electrical connection between a circuit element (e.g., a metal wire, an active area, etc.) and the first metal interconnect layer 104 and the third metal interconnect layer 110.

In some embodiments, the plurality of connection pins comprise a first set of connection pins 106a-106d and a second set of connection pins 108a-108d. In some embodiments, the first set of connection pins 106a-106d and the second set of connection pins 108a-108d alternatively straddle opposite edges of the first lower metal wire 104a and/or opposite edges of the second lower metal wire 104b so as to provide connections to opposing sides of the metal wires. For example, the first set of connection pins 106a-106d extend from a first end overlying the first lower metal wire 104a to a second end offset from a first edge 103 of the first lower metal wire 104a. In some embodiments, first edges of the first set of connection pins 106a-106d are aligned and the second edges of the first set of connection pins 106a-106d are aligned (along line 107). The second set of connection pins 108a-108d extend from a first end overlying the first lower metal wire 104a to a second end offset from a second edge 105 of the first lower metal wire 104a. In some embodiments, first edges of the second set of connection pins 108a-108d are aligned and the second edges of the second set of connection pins 108a-108d are aligned (along line 109).

In some embodiments, one or more of the plurality of connection pins may have different lengths. In some embodiments, the different lengths of the connection pins may cause one or more of the connection pins to straddle more than one edge of the first metal interconnect layer 104 and/or more than one metal wire of the first metal interconnect layer 104. For example, one or more of the connection pins, 108c and 108d, may have lengths that cause the connection pins, 108c and 108d, to straddle opposing edges of the first lower metal wire 104a and/or opposite edges of the second lower metal wire 104b.

Connecting both the first set of connection pins 106a-106d and the second set of connection pins 108a-108d to the first metal interconnect layer 104 and the third metal interconnect layer 110 forms a dual level power structure, which allows for power to be carried by both the first metal interconnect layer 104 and the third metal interconnect layer 110. This reduces the current density on connections to the connection pins, 106 and 108, thereby reducing electromigration and IR issues (due to a lower resistance of the power rails).

Figure 2:
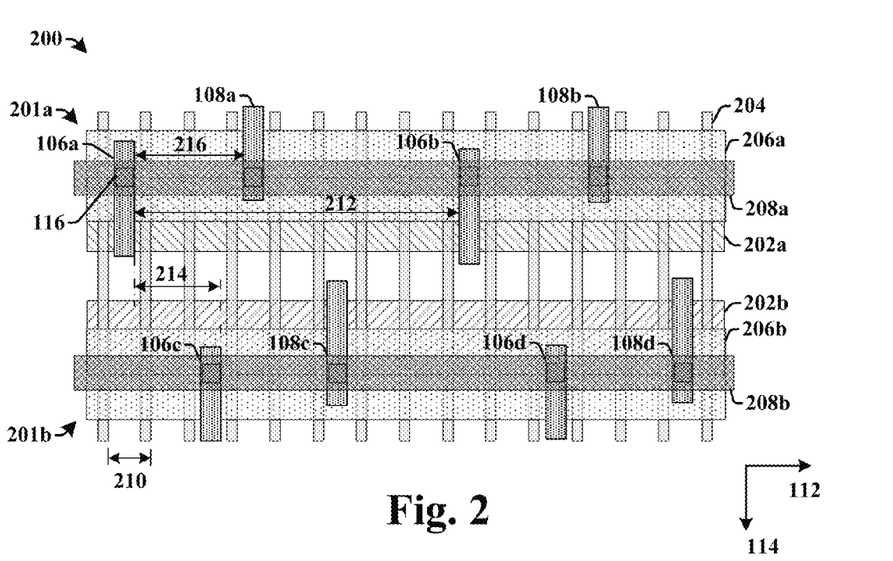
FIG. 2 illustrates a top-view of some embodiments of an integrated chip comprising a dual power rail structure having a plurality of connection pins.

FIG. 2 illustrates a top-view of some embodiments of an integrated chip 200 having a dual power rail structure with a plurality of connection pins.

The integrated chip 200 includes one or more well regions 202 respectively comprising one or more active areas. In some embodiments, wherein the integrated chip comprises FinFET (field effect transistor) devices, the active areas may comprise one or more fins of semiconductor material protruding outward from the semiconductor substrate 102 and laterally separated by isolation structures (e.g., shallow trench isolation (STI) regions). In some embodiments, the integrated chip 200 may include multiple well regions, 202a and 202b, which are doped to have different doping types (e.g., n-type doping and p-type doping) that modulate the electrical properties of the active areas. For example, the well regions, 202a and 202b, may comprise opposite doping types (e.g., an n-well 202a arranged within a p-type substrate may comprise a PMOS active area and a p-well 202b arranged within an n-type substrate may comprise an NMOS active area). Source/drain regions may be arranged within the semiconductor substrate in the active areas of the well regions, 202a and 202b. The source/drain regions have opposite doping types as the well regions, 202a and 202b.

The well regions, 202a and 202b, comprise active areas (having source/drain regions) that extend in a first direction 112. A plurality of gate structures 204 extend over the well regions, 202a and 202b, along a second direction 114 that is perpendicular to the first direction 112. The plurality of gate structures 204 are arranged at a gate pitch 210 (e.g., a contact poly pitch).

In some embodiments, dual power rails, 201a and 201b, may be arranged over or adjacent to the well regions, 202a and 202b, and/or the active areas therein. In other embodiments, the dual power rails, 201a and 201b, may be arranged at locations offset from the well regions, 202a and 202b, and/or the active areas therein. The dual power rail structures, 201a and 201b, respectively comprise a first lower power rail 206a and a second lower power rail 206b arranged in parallel over the plurality of gate structures 204. The dual power rails, 201a and 201b, also respectively comprise a first upper power rail 208a and a second upper power rail 208b arranged in parallel over the first lower power rail 206a and the second lower power rail 206b. In some embodiments, the first lower power rail 206a and a second lower power rail 206b are located within a first metal interconnect layer (e.g., a first metal wire layer (M1)), while the first upper power rail 208a and the second upper power rail 208b are located within an overlying third metal interconnect layer (e.g., a third metal wire layer (M3)).

The dual power rails, 201a and 201b, are respectively configured to distribute a voltage potential from integrated chip pins to multiple devices in the integrated chip 200. In some embodiments, the dual power rails, 201a and 201b, are on different electrical nets. For example, in some embodiments, the first lower power rail 206a and the first upper power rail 208a may be held at a supply voltage (e.g., $V_{DD}$), while the second lower power rail 206b and the second upper power rail 208b may be held at a ground voltage (e.g., $V_{SS}$).

A second metal interconnect layer (e.g., a second metal wire layer (M2)) is arranged vertically between the first metal interconnect layer and the third metal interconnect layer. The second metal interconnect layer comprises a plurality of connection pins, 106 and 108. The plurality of connection pins, 106 and 108, comprise a first set of connection pins 106a-106d and a second set of connection pins 108a-108d. The first set of connection pins 106a-106d straddle a first edge of the lower power rails 206a-206b, while the second set of connection pins 108a-108d straddle an opposite, second edge of the lower power rails 206a-206b.

The plurality of connection pins, 106 and 108, are connected to the dual power rail structures, 201a and 201b. For example, connection pins 106a-106b and 108a-108b are electrically connected to the first lower power rail 206a and the first upper power rail 208a by way of conductive vias (e.g., conductive vias 116). Similarly, connection pins 106c-106d and 108c-108d are electrically connected to the second lower power rail 206b and the second upper power rail 208b by way of conductive (e.g., conductive vias 116). The first set of connection pins 106a-106d comprise connection pins 106a and 106b that are configured to provide an electrical connection between dual power rail structure 201a and semiconductor devices within a first well region 202a (a first active arranged on a first side of dual power rail structure 201a). The second set of connection pins 108a-108d comprise connection pins 108c and 108d that are configured to provide an electrical connection between the dual power rail structure 201b and semiconductor devices within a second well region 202b (a second active area arranged on a second side of dual power rail structure 201b).

In some embodiments, the plurality of connection pins, 106 and 108, may be arranged at a spacing that is configured to provide access to routing wires that connect devices within the active area to an overlying metal layer (i.e., to prevent pin access issues during auto place and routing). For example, connection pins 106a-106b straddling the first edge of a lower power rail (e.g., first lower power rail 206a or second lower power rail 206b) are arranged at a first pitch 212. Connection pins 106a-106b straddling the first edge of a first lower power rail 206a are arranged with respect to connection pins 106c-106d straddling a first edge (facing away from the first edge of the first lower power rail 206a) of a second lower power rail 206b (i.e., connection pins straddling a power rail on a different electrical net) at a second pitch 214 smaller than the first pitch 212. Connection pins 106a-106b straddling the first edge of a first lower power rail 206a are arranged with respect to connection pins 108a-108b straddling the second edge of the first lower power rail 206a at a third pitch 216 smaller than the first pitch 212 and larger than the second pitch 214.

In some embodiments, the first pitch 212 is equal to the gate pitch 210 multiplied by a first even number (i.e., first pitch 212=gate pitch 210×2n$_1$, where n$_1$≥1), the second pitch 214 is equal to the pitch of the plurality of gate structures multiplied by a second even number (smaller than the first even number) (i.e., second pitch 214=gate pitch 210×2n$_2$, where n$_2$≥1), and the third pitch 216 is equal to the pitch of the plurality of gate structures multiplied by an odd number (i.e., third pitch 216=gate pitch 210×(2n$_3$+1), where n$_3$≥0). For example, the first pitch 212 may be equal to eighteen times a gate pitch 210 (e.g., a contact poly pitch), the second pitch 214 is equal to three times the gate pitch, and the third pitch 216 is equal to twice the gate pitch.

FIGS. 3A-3F illustrate some additional embodiments of an integrated chip having a dual power rail structure with a plurality of connection pins.

Figure 3A:
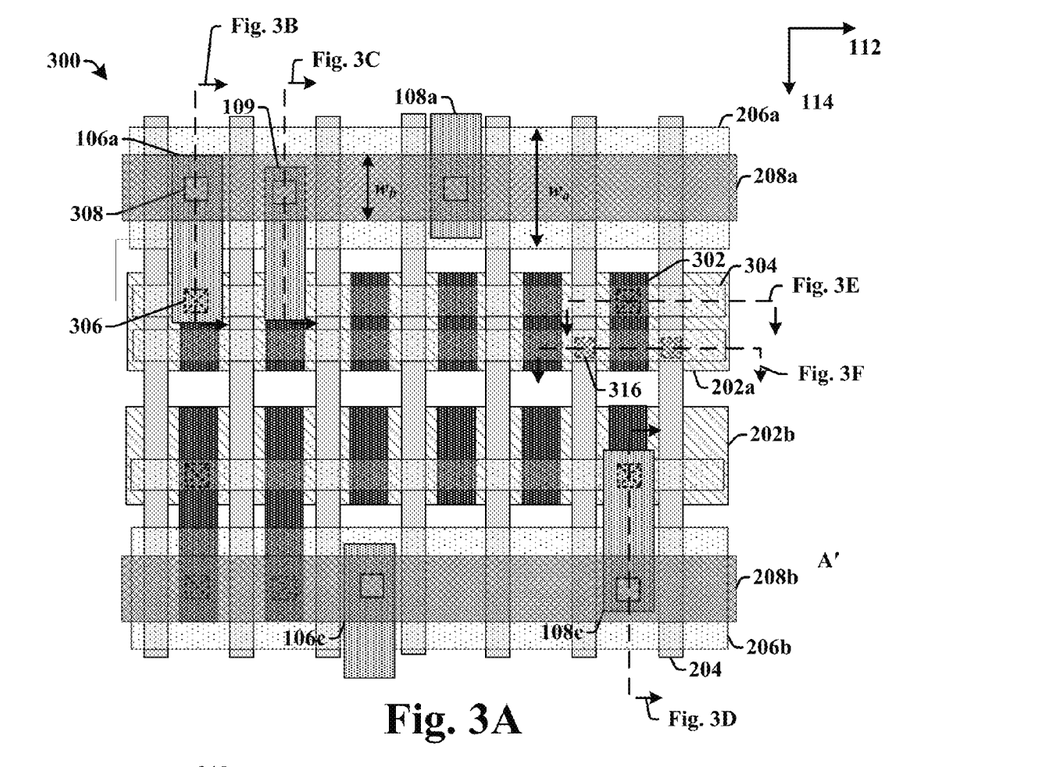
FIGS. 3A-3F illustrate some additional embodiments of an integrated chip comprising a dual power rail structure having a plurality of connection pins.

FIG. 3A illustrates a top-view of some additional embodiments of an integrated chip 300 having a dual power rail structure.

The integrated chip 300 comprises well regions 202a-202b having active areas comprising a plurality of source/drain regions extending in a first direction 112. A plurality of middle-of-the-line (MOL) structures 302 are arranged over the well regions 202a-202b. The plurality of MOL structures 302 extend along a second direction 114 at locations between adjacent ones of a plurality of gate structures 204. In various embodiments, the MOL structures 302 may comprise a conductive metal (e.g., tungsten, copper, cobalt, etc.).

A first metal interconnect layer is arranged over the plurality of gate structures 204. The first metal interconnect layer comprises a first lower power rail 206a, a second lower power rail 206b, and one or more metal wire tracks 304 arranged between the first lower power rail 206a and the second lower power rail 206b (in the second direction 114). A second metal interconnect layer is arranged over a first metal interconnect layer and comprises a plurality of connection pins, 106 and 108. A third metal interconnect layer is arranged over the second metal interconnect layer and comprises a first upper power rail 208a overlying the first lower power rail 206a and a second upper power rail 208b overlying the second lower power rail 206b. In some embodiments, the third metal interconnect layer may also comprise multiple metal wire tracks extending in parallel to the upper power rails and arranged over the well regions 202a-202b.

The plurality of connection pins, 106 and 108, extend from over the MOL structures 302 to between the lower power rails 206a-206b and the upper power rails 208a-208b. In some embodiments, the first lower power rail 206a has a first width w$_a$, and the first upper power rail 208a has a second width w$_b$ that is smaller than the first width w$_a$. In some embodiments, the one or more metal wire tracks 304 may have a width that is less than a width of the first lower power rail 206a and the second lower power rail 206b.

Figure 3B:
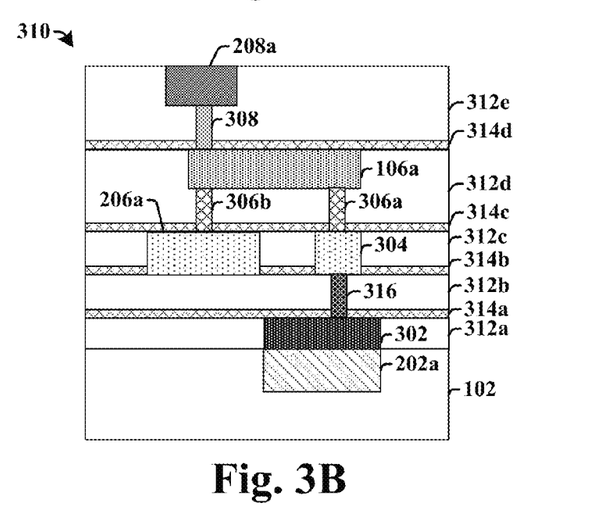

FIG. 3B illustrates a cross-sectional view 310 of some additional embodiments of integrated chip 300 shown along a first cross-sectional line illustrated in FIG. 3A.

As shown in cross-sectional view 310, the MOL structures 302 are arranged onto a first well region 202. In some embodiments, the MOL structure 302 may be confined to above the first well region 202a (i.e., be laterally offset from the first lower power rail 206a).

A first inter-level dielectric (ILD) layer 312a is arranged over the semiconductor substrate 102 at locations laterally surrounding the MOL structures 302. A conductive contact 316 is disposed within a second ILD layer 312b overlying the first ILD layer 312a. The conductive contact 316 connects the MOL structures 302 to the first metal wire track 304 arranged within a third ILD layer 312c overlying the second ILD layer 312b. The first metal wire track 304 is further connected to a connection pin 106a by way of a first conductive via 306a arranged within the fourth ILD layer 312d overlying the third ILD layer 312c. The connection pin 106a connects the first metal wire track 304 to the first lower power rail 206a (by way of a first conductive via 306b) and to the first upper power rail 208a arranged within the fifth ILD layer 312e overlying the fourth ILD layer 312d (by way of a second conductive via 308).

In some embodiments, adjacent ILD layers 312a-312e may be separated by etch stop layers 314a-314d. For example, the first ILD layer 312a may be vertically separated from the second ILD layer 312b by a first etch stop layer 314a, and the second ILD layer 312b may be vertically separated from the third ILD layer 312c by a second etch stop layer 314b, etc. In various embodiments, the etch stop layers 314a-314d may comprise a nitride, such as silicon nitride, for example.

Figure 3C:
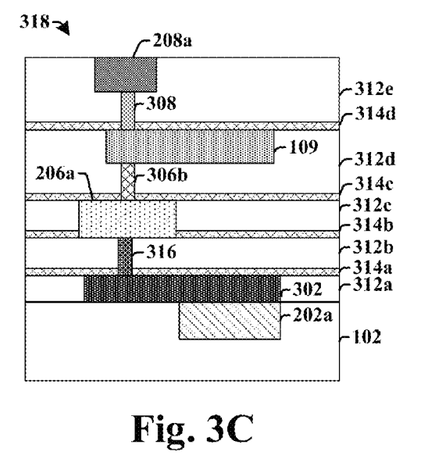

FIG. 3C illustrates a cross-sectional view 318 of some additional embodiments of integrated chip 300 shown along a second cross-sectional line illustrated in FIG. 3A.

As shown in cross-sectional view 318 the MOL structure 302 extends from over the first well region 202a to a position below the first lower power rail 206a. The MOL structure 302 is connected to the second lower power rail 206b by a conductive contact 316 that is laterally offset from the first well region 202a. In some embodiments, the second metal interconnect layer may comprise a structure 109 that extends over the first well region 202a without connected to a conductive contact overlying the first well region 202a. In such embodiments, the structure 109 meets minimum area design requirements.

Figure 3D:
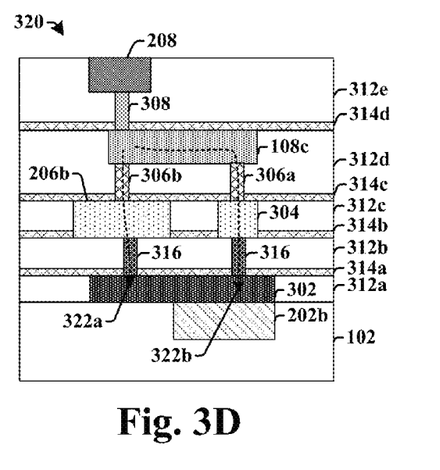

FIG. 3D illustrates a cross-sectional view 320 of some additional embodiments of integrated chip 300 shown along a third cross-sectional line illustrated in FIG. 3A.

As shown in cross-sectional view 320 the MOL structure 302 extends from over the second well region 202b to a position below second lower power rail 206b. The MOL structure 302 is connected to the second upper power rail 208b by way of a first conductive path 322a and a second conductive path 322b extending thorough the second metal layer 108c to further improve IR/EM.

Figure 3E:
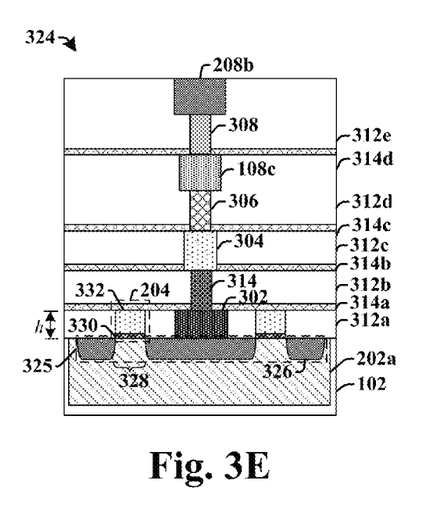

FIG. 3E illustrates a cross-sectional view 324 of some additional embodiments of integrated chip 300 shown along a fourth cross-sectional line illustrated in FIG. 3A.

As shown in cross-sectional view 324, the first well region 202a comprises an active area 325 comprising a plurality of source/drain regions 326. The plurality of source/drain regions 326 comprise highly doped regions (e.g., having a doping concentration greater than that of the surrounding semiconductor substrate 102) that are laterally separated from one another by channel regions 328. In some embodiments, the first well region 202a may comprise a doping type opposite the semiconductor substrate 102 and the source/drain regions 326 (e.g., an n-well formed within a p-type substrate may comprise p-type source/drain regions within a PMOS active area).

The MOL structure 302 is arranged over the source/drain regions 326, while a plurality of gate structures 204 are arranged over the channel regions 328. In some embodiments, the plurality of gate structures 204 may respectively comprise a gate electrode 332 separated from the semiconductor substrate 102 by way of a gate dielectric 330. In various embodiments, the gate electrode 332 may comprise polysilicon or a metal (e.g., aluminum). In various embodiments, the gate dielectric 330 may comprise an oxide (e.g., silicon dioxide) or a high-k material. In some embodiments, the plurality of gate structures 204 and the MOL structure 302 may have an approximately same height h.

Figure 3F:
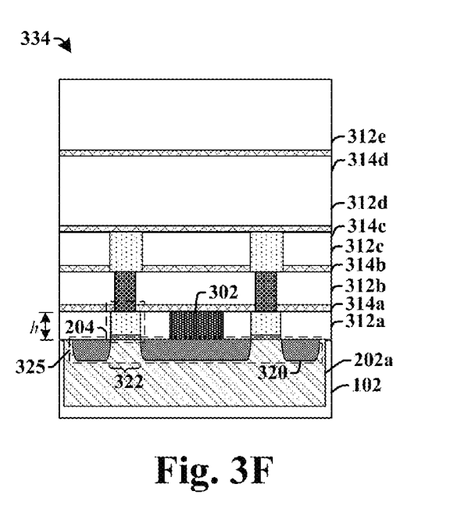

FIG. 3F illustrates a cross-sectional view 334 of some additional embodiments of integrated chip 300 shown along a fourth cross-sectional line illustrated in FIG. 3A.

As shown in cross-sectional view 334, the metal track 304 can also be connected to gate structures 204 to act as input and output pins for input and output signals a transistor device.

Figure 4:
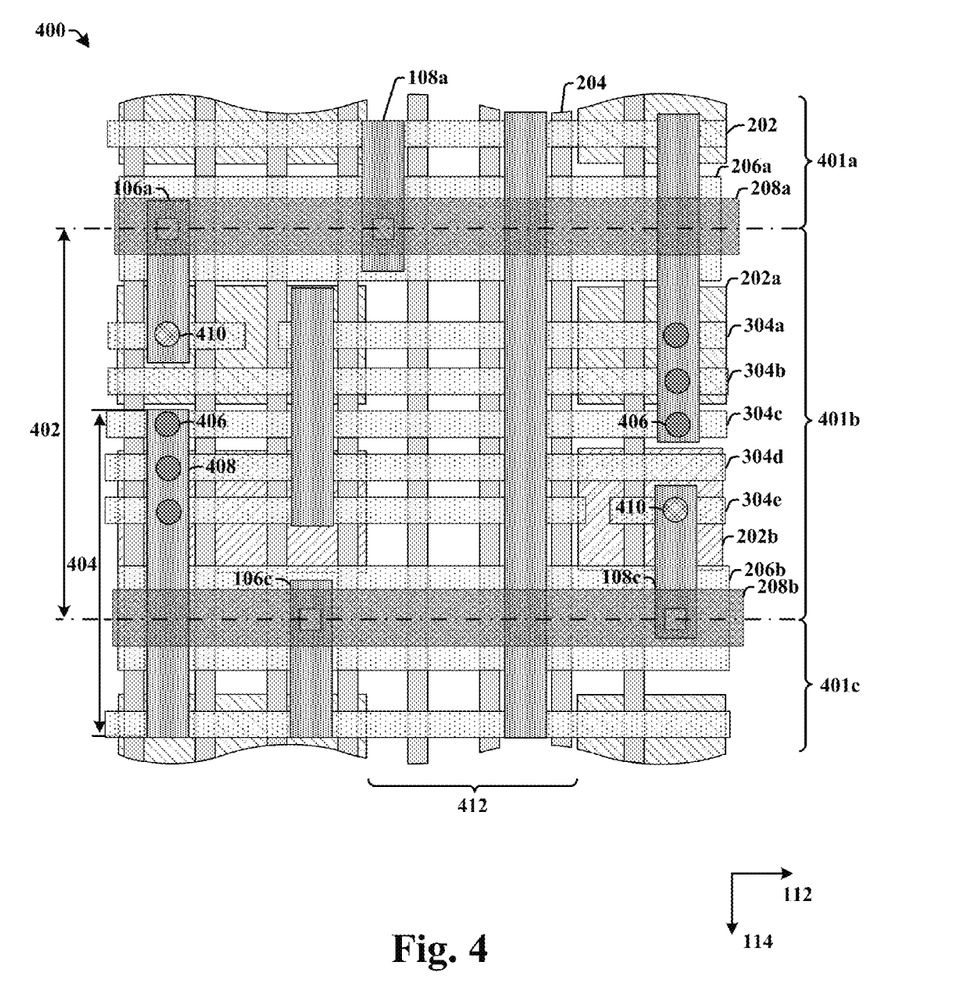
FIG. 4 illustrates some additional embodiments of an integrated chip comprising a dual power rail structure having a plurality of connection pins.

FIG. 4 illustrates some additional embodiments of an integrated chip 400 having a dual power rail structure with connection pins.

The integrated chip 400 comprises a first metal interconnect layer having lower power rails 206a-206b respectively arranged between abutting cells 401. For example, a first lower power rail 206a is arranged between a first cell 401a and a second cell 401b and a second lower power rail 206b is arranged between the second cell 401b and a third cell 401c. A cell height 402 extends from a center of a first lower power rail 206a to a center of a second lower power rail 206b. In some embodiments, the first metal interconnect layer comprises five metal wire tracks 304a-304e arranged between the first lower power rail 206a and the second lower power rail 206b and extending in the first direction 112.

A second metal interconnect layer comprises a plurality of connection pins, 106 and 108, for device power (e.g., a plurality of connection pins coupled between $V_{DD}$ or $V_{SS}$ to one or more devices), that are arranged over the first metal interconnect layer. In some embodiments, the plurality of connection pins, 106 and 108, for device power, are connected to transistor devices within a well region, 202a or 202b, by vias arranged at connection points 410. The plurality of connection pins, 106 and 108, are configured to electrically couple the transistor devices within the well region, 202a or 202b, to the lower power rails 206a-206b and to upper power rails 208a-208b arranged on a third metal interconnect layer overlying the second metal interconnect layer.

In some embodiments, the connection pins, 106 and 108, may be arranged so as to occupy a first metal wire track (e.g., metal wire track 304a for pin 106a and metal wire track 304e for pin 108c), while leaving one or more metal wire tracks accessible for the placement of vias at pin access points 406, thereby enabling device signal routing (e.g., on the one or more metal wire tracks or on overlying metal interconnect layers) from semiconductor devices within the active area of the well region 202. In some embodiments, the connection pins, 106 and 108, are arranged at a location within a cell 401 that is configured to provide for multiple different pin access points 406 at which vias can be placed to enable device signal routing, so as to enable flexibility of signal routing.

In some embodiments, the metal wire tracks connected to connection pins, 106 and 108, are separated by one or more metal wire tracks from metal wire tracks used for device signal routing so as to avoid electrical shorting. For example, the connection pins, 106 and 108, may be arranged to occupy metal wire track 304a, metal wire tracks 304c-304e may be used for device signal routing, and metal wire track 304b is left unoccupied to avoid electrical shorting between device power and signal routing.

In some embodiments, the second metal interconnect layer may also comprise a metal routing structure 408 that is connected to one or more of the pin access points 406 within a cell 401. The metal routing structure 408 is configured to route signals from semiconductor devices within the active area to overlying metal interconnect layers. In some embodiments, the connection pins for device power, 106 and 108, may have a minimum length configured to prevent semiconductor process issue (e.g., the connection pins, 106 and 108, for device power cannot have a length that is less than a distance between cut regions of a cut mask). Furthermore, in some embodiments, in order to ensure enough single pin access points 406 for metal routing structure 408, the length of the connection pins, 106 and 108, for device power may have a maximum length over well regions 202 that is not greater than or equal to approximately 50% of the cell height 402. In some embodiments, in areas 412 where there is no well regions and/or active areas, a length of the connection pins, 106 and 108, for device power may be allowed to extent along a length that is greater than or equal to approximately 50% of the cell height 402.

Figure 5:
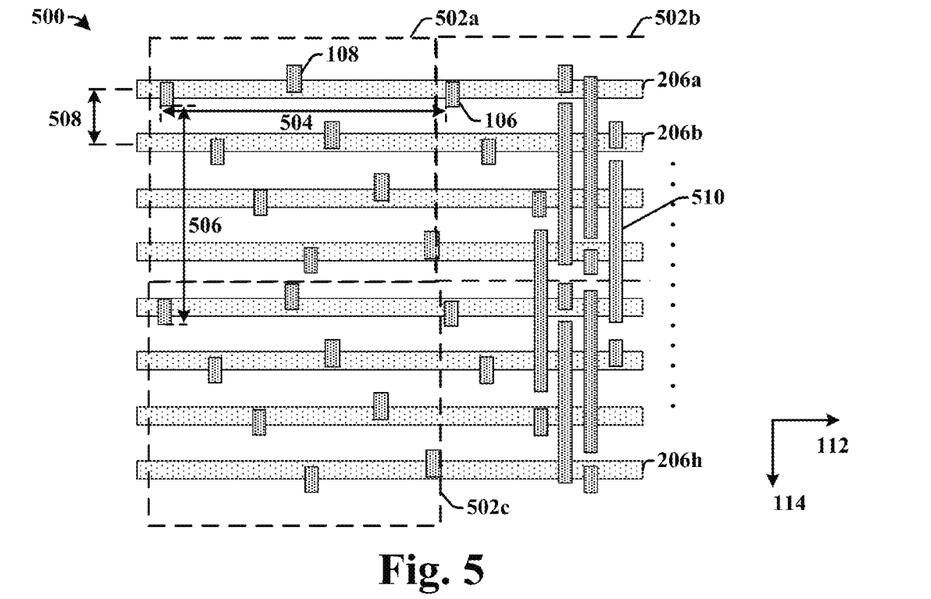
FIGS. 5-6 illustrate top-view of some embodiments of an integrated chip having a plurality of power rail structures with connection pins.

FIG. 5 illustrates a top-view of some embodiments of an integrated chip 500 having connection pins arranged in a repeating pattern.

The integrated chip 500 comprises a first metal interconnect layer having a plurality of lower power rails 206a-206h arranged in parallel and extending in a first direction 112. A second metal interconnect layer is arranged over the first metal interconnect layer and comprises a first set of connection pins 106 and a second set of connection pins 108. The first set of connection pins 106 straddle a first edge of the plurality of lower power rails 206a-206h, while the second set of connection pins 108 straddle a second edge of the plurality of lower power rails 206a-206h, opposite the first edge.

The first metal interconnect layer and the second metal interconnect layer are arranged in repeating units 502a-502c that repeat in the first direction 112 and the second direction 114. For example, in the first direction 112, connection pins, 106 and 108, located within a first unit 502a are separated from laterally aligned connection pins, 106 and 108, located within a second unit 502b by a first distance 504. In the second direction 114, connection pins, 106 and 108, located within the first unit 502a are separated from vertically aligned connection pins, 106 and 108, located within a third unit 502c by a second distance 506 that is equal to four times a cell height 508 (i.e., the distance from the center of a first lower power rail 206a to a center of a second lower power rail 206b). The repeating units 502a-502c comprise the dual power rail and provide a uniform routing wire 510 for connecting signals.

Figure 6:
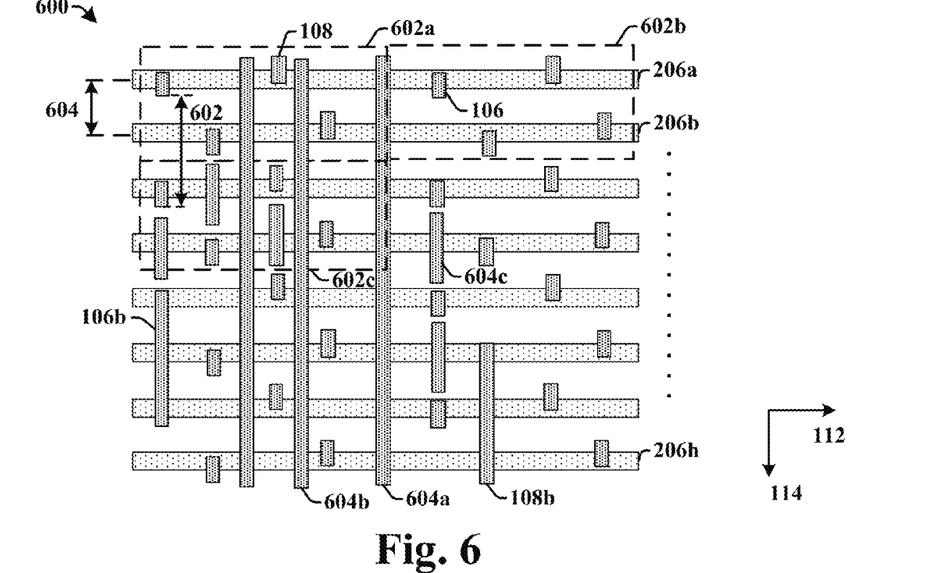

FIG. 6 illustrates a top-view of some alternative embodiments of an integrated chip 600 having connection pins arranged in a repeating pattern.

The integrated chip 600 comprises a first metal interconnect layer having a plurality of lower power rails 206a-206h arranged in parallel and extending in a first direction 112. A second metal interconnect layer is arranged over the first metal interconnect layer and comprises a first set of connection pins 106 and a second set of connection pins 108. The first set of connection pins 106 straddle a first edge of the plurality of lower power rails 206a-206h, while the second set of connection pins 108 straddle a second edge of the plurality of lower power rails 206a-206h, opposite the first edge.

The first metal interconnect layer and the second metal interconnect layer are arranged in repeating units 602a-602c that repeat in the first direction 112 and the second direction 114. For example, units 602a and 602b repeat in the first direction 112 as described above in relation to FIG. 5. In the second direction 114, connection pins, 106 and 108, located within the first unit 602a are separated from vertically aligned connection pins, 106 and 108, located within a third unit 602c by a distance that is equal to twice a cell height 604 (i.e., the distance from the center of a first lower power rail 206a to a center of a second lower power rail 206b). The repeating units 602a-602c comprise dual power rail (e.g., 206a and 206b) and the routing wire 604a-604c. In some embodiments, the routing wire 604a-604b has no length limitation in the 114 direction and therefore are given more degree of freedom for routing signal.

In some embodiments, it will be appreciated that the less dense unit placement in integrated chip 600 allows connection pins 106 or 108 have a length, as shown by connection pins 106b and 108b, that allows the connection pins 106b or 108b to connect to multiple first lower metal power rails 206a-206h. This provides for greater flexibility in IR/EM improvement on the second metal interconnect layer.

FIGS. 7-11 illustrate some embodiments of a method of forming an integrated chip having a dual power rail structure with a plurality of connection pins.

Figure 7:
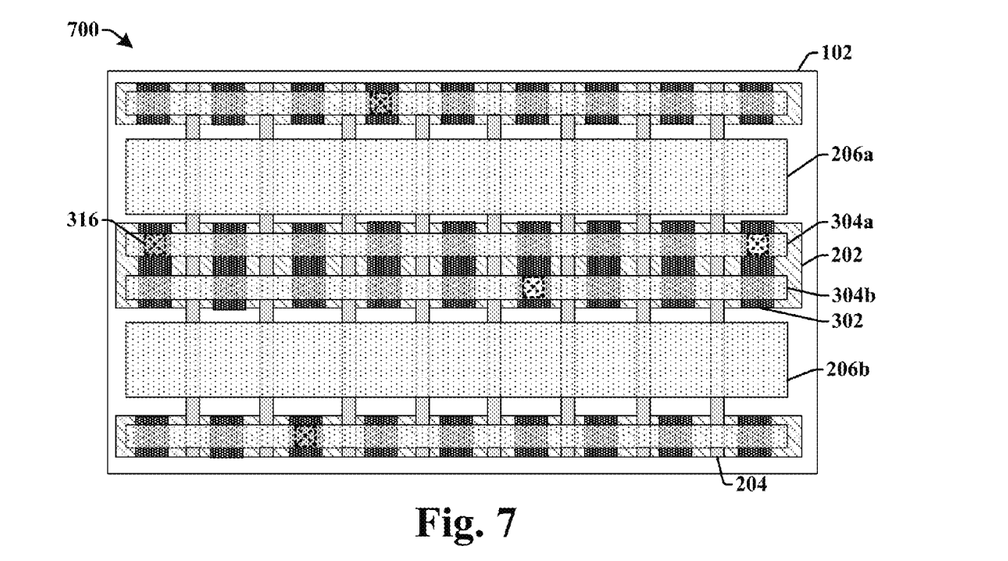
FIGS. 7-11 illustrate some embodiments of a method of forming an integrated chip comprising a dual power rail structure having a plurality of connection pins.

As shown in top-view 700 of FIG. 7, a plurality of gate structures 204 are formed over a semiconductor substrate 102. In various embodiments, the semiconductor substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, the plurality of gate structures 204 may be formed by forming a gate dielectric film over the semiconductor substrate 102, and subsequently forming a gate electrode film over the gate dielectric film. The gate dielectric film and the gate electrode film are subsequently patterned according to photolithography process to form a plurality of gate structures 204.

A well region 202 is formed between the plurality of gate structures 204. The well region 202 comprises an active area having a plurality of source/drain regions. In some embodiments, the plurality of source/drain regions may be formed by an implantation process that selectively implants a dopant species into the semiconductor substrate. In various embodiments, the dopant species may comprise a p-type dopant (e.g., boron, gallium, etc.) or an n-type dopant (e.g., phosphorus, arsenic, etc.). In other embodiments, the plurality of source/drain regions may be formed by an epitaxial growth process.

A plurality of MOL structures 302 are formed over the well region 202 at locations laterally interleaved between the plurality of gate structures 204. The plurality of MOL structures 302 may be formed by forming a MOL layer onto the semiconductor substrate 102. The MOL layer is then patterned according to a photolithography process to form the plurality of MOL structures 302 over the source/drain regions.

A first metal interconnect layer is formed over the plurality of gate structures 204 and the plurality of MOL structures 302. The MOL structures 302 are connected to the first metal interconnect layer by way of one or more conductive contacts 316. The first metal interconnect layer comprises a first lower power rail 206a and a second lower power rail 206b that are offset from opposite sides of the well region 202. The first metal interconnect layer further comprises one or more metal wire tracks 304a-304b arranged over the well region 202 and extending in parallel to the first lower power rail 206a and the second lower power rail 206b. In some embodiments, the one or more conductive contacts 316 are formed by depositing a first inter-level dielectric (ILD) layer surrounding the MOL structure 302 and a second ILD layer over the first ILD layer. The second ILD layer is subsequently etched to form a contact opening, into which a conductive material (e.g., tungsten, copper, etc.) may be formed. The first metal interconnect layer may be formed by depositing a third ILD layer over the second ILD layer. The third ILD layer is subsequently etched to form a plurality of metal trenches. A conductive material (e.g., tungsten, copper, etc.) may be formed within the plurality of metal trenches.

Figure 8:
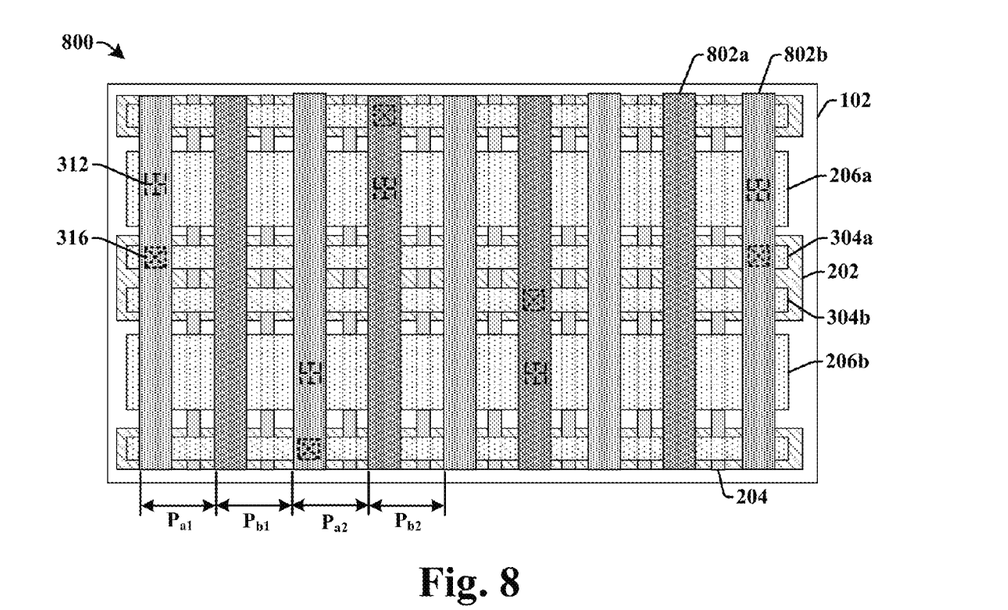

As shown in top-view 800 of FIG. 8, a second metal interconnect layer 802 comprising a plurality of metal wires 802a-802b is formed over the first metal interconnect layer. The second metal interconnect layer 802 is connected to the first metal interconnect layer by one or more conductive vias 312 underlying the second metal interconnect layer. In some embodiments, the one or more conductive vias 312 and the second metal interconnect layer 802 are formed by etching a fourth ILD layer over the third ILD layer to form one or more via openings and a metal trench. A conductive material (e.g., tungsten, copper, etc.) may be formed within the one or more via openings and the metal trench.

In some embodiments, the second metal interconnect layer 802 may be formed by way of a double patterning process (e.g., a SADP, LELE, etc.). The double patterning process causes alternating ones of the plurality of second metal interconnect layer 802 to be formed by different photomasks. For example, a first plurality of metal wires 802a may be formed by a first mask and a second plurality of metal wires 802b may be formed by a second mask. The double patterning process causes alternating ones of the metal wires 802a-802b to be arranged at a first pitch $P_a$ (a pitch of a first mask of the double patterning process) or a second pitch $P_b$ (a pitch of a second mask of the double patterning process). In some embodiments misalignment errors may cause the first and second pitches, $P_a$ and $P_b$, to be slightly different. For example, the first pitch $P_a$ may have a pitch $P_{a1}$ that is equal to approximately $1.02$~$0.98*P_{a2}$ and the second pitch $P_b$ may have a pitch $P_{b1}$ that is equal to approximately $1.02$~$0.98*P_{b2}$. The double patterning process allows for the metal wires on the second metal interconnect layer 802 to be arranged at a pitch that is in a range of between 0.95 and 1.05 a minimum pitch of the second metal interconnect layer 802.

Figure 9:
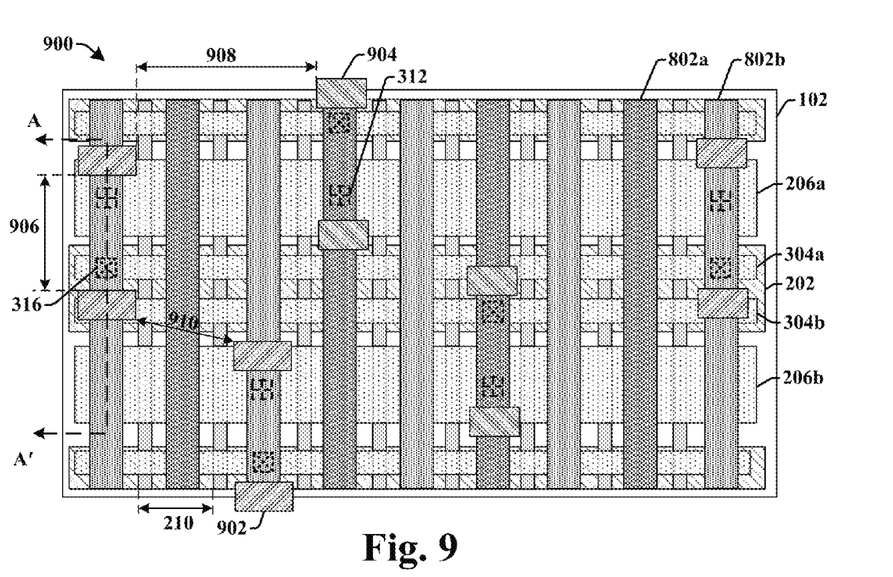
Figure 10A:
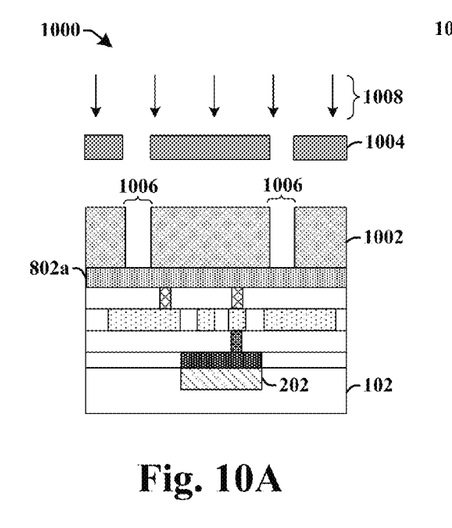
Figure 10B:
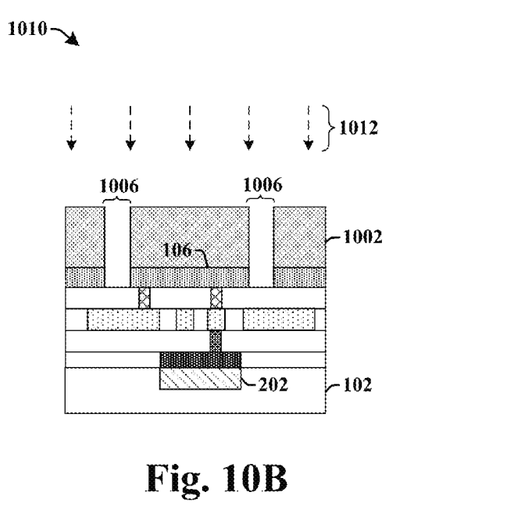

FIGS. 9-10B illustrate cutting the second metal interconnect layer 802 to form a first set of connection pins 106 and a second set of connection pins 108. While FIGS. 9-10B illustrate the use of a 'cut last' technique, it will be appreciated that other cut techniques may be used. For example, in some alternative embodiments, a 'cut first' technique may be used to form a material on cut regions so that the second metal interconnect layer 802 will be excluded from being formed in the cut regions.

As shown in top-view 900 and cross-sectional view of FIG. 9, the second metal interconnect layer 802 may be selectively cut (i.e., trimmed) according to one or more cut masks. In some embodiments, the second metal interconnect layer 802 may be selectively cut according to a first plurality of cut regions 902 of a first cut mask and according to a second plurality of cut regions 904 of a second cut mask. The first plurality of cut regions 902 may be used in a first patterning process to selectively remove parts of the second metal interconnect layer 802 to form a first set of connection pins 106. The second set of cut regions 904 may be used in a second patterning process to selectively remove parts of the second metal interconnect layer 802 to form a second set of connection pins 108. In other embodiments (not shown), the second metal interconnect layer 802 may be selectively cut according to a single cut mask.

In some embodiments, the positions of the cut regions, 902 and 904, may be controlled by design rules to prevent small spaces that can increase mask costs. For example, in some embodiments, the cut regions may have a minimum end-to-end spacing 906, a minimum side-to-side spacing 908, and/or a minimum corner-to-corner spacing 910. The minimum end-to-end spacing 906 is the space between the short sides of the short side of the cut masks, while the minimum side-to-side spacing 908 is the spacing between long sides of the cut regions. In some embodiments, the minimum end-to-end spacing 906, the minimum side-to-side spacing 908, and the minimum corner-to-corner spacing 910 may be in a range of between approximately 1.5 times the gate pitch and approximately 2.5 times the gate pitch 210. In other embodiments, the minimum corner-to-corner spacing 910 may be greater than 2.5 times the gate pitch 210. Such a larger corner-to-corner spacing 910 allows for a single cut mask to be used to form the cut regions 902 and 904. As shown in cross-sectional view 1000 (shown along cross-sectional line A-A') of FIG. 10A, a patterning process patterns a masking layer 1002 overlying the semiconductor substrate 102 according to a cut mask 1004 to form openings 1006 within the masking layer 1002. The openings 1006 are arranged over a part of one of the second plurality of metal wires 802b. In some embodiments, the masking layer 1002 may comprise a photoresist layer. In such embodiments, the masking layer 1002 may be patterned by selectively exposing the masking layer 1002 to radiation 1008 according to the cut mask 1004, and subsequently developing the masking layer 1002 to form the openings 1006.

As shown in cross-sectional view 1010 of FIG. 10B, an etching process is used to selectively remove a part of the second metal wire (e.g., 802b of FIG. 10A) according to the openings 1006 to form a connection pin 106. The etching process exposes the second metal wire (e.g., 802b of FIG. 10A) underlying the openings 1006 to an etchant 1012, which selectively cuts or trims the second metal wire. In various embodiments, the etchant 1012 may comprise a dry etchant (e.g., a plasma etch with tetrafluoromethane ($CF_4$), sulfur hexafluoride ($SF_6$), nitrogen trifluoride ($NF_3$), etc.) or a wet etchant (e.g., hydroflouric (HF) acid).

Figure 11:
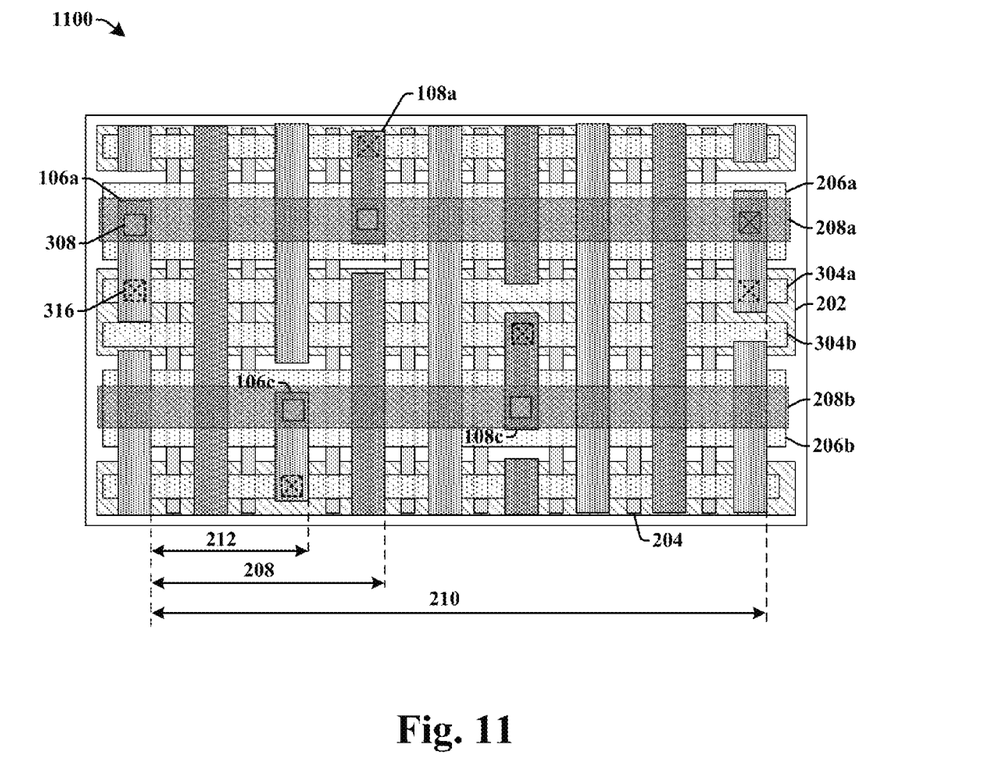

As shown in top-view 1100 and cross-sectional view of FIG. 11, a third metal interconnect layer is formed over the second metal interconnect layer. The third metal interconnect layer comprises a first upper power rail 208a and a second upper power rail 208b. The first upper power rail 208a overlies and extends parallel to the first lower power rail 206a and is connected to the first set of connection pins 106 and to the second set of connection pins 108 by a second plurality of conductive vias 308. The second upper power rail 208b overlies and extends parallel to the second lower power rail 206b and is connected to the first set of connection pins 106 and to the second set of connection pins 108 by a second plurality of conductive vias 308. In some embodiments, the one or more conductive vias 308 and the third metal interconnect layer are formed by etching a fifth ILD layer over the fourth ILD layer to form one or more via openings and a metal trench. A conductive material (e.g., tungsten, copper, etc.) may be formed within the one or more via openings and the metal trench.

Figure 12:
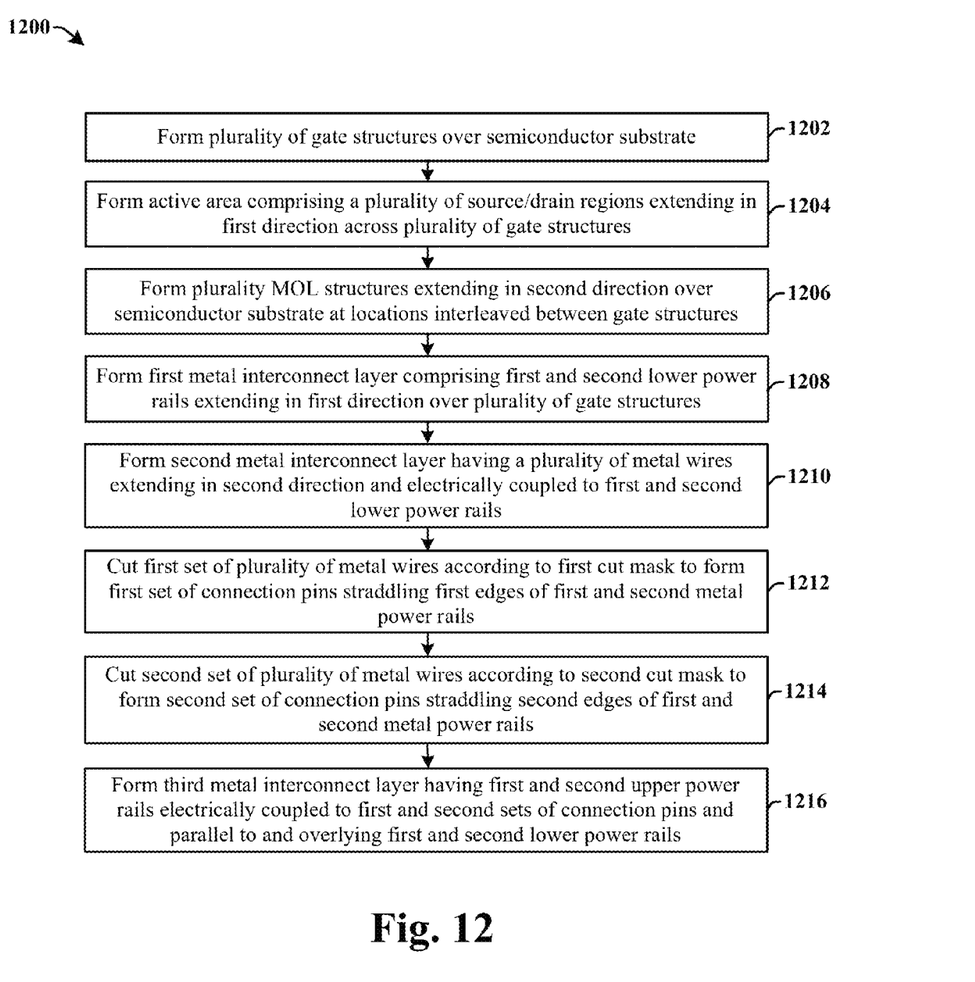
FIG. 12 illustrates a flow diagram of some embodiments of a method of forming an integrated chip comprising a dual power rail structure having a plurality of connection pins.

FIG. 12 illustrates a flow diagram of some embodiments of a method 1200 of forming an integrated chip having a dual power rail structure with a plurality of connection pins.

While the disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a plurality of gate structures are formed over a semiconductor substrate. In some embodiments, the plurality of gate structures may be formed over a well region having an opposite doping type as the semiconductor substrate. FIG. 7 illustrates some embodiments corresponding to act 1202.

At 1204, an active area is formed within the semiconductor substrate. The active area extends in a first direction across the plurality of gate structures. In some embodiment, the active area may comprise source/drain region arranged within a substrate. In other embodiments, the active area may comprise a plurality of fins of semiconductor material may be formed to protrude from a semiconductor substrate in some embodiments FIG. 7 illustrates some embodiments corresponding to act 1204.

At 1206, a plurality of MOL structures are formed extending over the semiconductor substrate in a second direction at locations interleaved between the plurality of gate structures. FIG. 7 illustrates some embodiments corresponding to act 1206.

At 1208, a first metal interconnect layer is formed over the plurality of gate structures. The first metal interconnect layer comprises a first lower power rail and a second lower power rail that extend in the first direction. In some embodiments, the first lower power rail and the second lower power rail are configured to provide a voltage (e.g., a supply voltage ($V_{SS}$) or a ground voltage ($V_{DD}$)) to multiple transistor devices arranged within the well region and/or active area. FIG. 7 illustrates some embodiments corresponding to act 1208.

At 1210, a second metal interconnect layer is formed over first metal interconnect layer. The second metal interconnect layer comprises a plurality of metal wires that extend in the second direction and are electrically coupled the first and second lower power rails by one or more conductive contacts. FIG. 8 illustrates some embodiments corresponding to act 1210.

At 1212, a first set of the plurality of metal wires are cut by a first cut mask to form a first set of connection pins. FIGS. 9-10B illustrate some embodiments corresponding to act 1212.

At 1214, a second set of the plurality of metal wires are cut by a second cut mask to form a second set of connection pins. FIGS. 9-10B illustrate some embodiments corresponding to act 1214.

At 1216, a third metal interconnect layer is formed. The third meal interconnect layer has a first upper power rail and a second upper power rail that overlie and are parallel to the first and second lower power rails. The first and second upper power rails are electrically coupled to the first and second sets of connection pins by one or more conductive contacts. FIG. 11 illustrates some embodiments corresponding to act 1216.

Therefore, the present disclosure relates to an integrated chip having a dual power rail structure configured to reduce current density and improve electromigration and IR specs, and an associated method of formation.

In some embodiments, the present disclosure relates to an integrated chip. The integrated chip comprises a first metal interconnect layer having a lower metal wire extending in a first direction. The integrated chip further comprises a second metal interconnect layer comprising a plurality of connection pins coupled to the lower metal wire by way of a first via layer and extending over the lower metal wire in a second direction perpendicular to the first direction. The integrated chip further comprises a third metal interconnect layer comprising an upper metal wire extending over the lower metal wire and the plurality of connection pins in the first direction. The upper metal wire is coupled to the plurality of connection pins by way of a second via layer arranged over the first via layer.

In some other embodiments, the present disclosure relates to an integrated chip. The integrated chip comprises a plurality of gate structures extending over an active area arranged within a semiconductor substrate, and a first metal interconnect layer comprising a lower power rail extending over the plurality of gate structures. The integrated chip further comprises a second metal interconnect layer overlying the first metal interconnect layer and comprising a first set of connection pins straddling a first edge of the lower power rail and a second set of connection pins straddling a second edge of the lower power rail, which is opposite the first edge. The first set of connection pins and the second set of connection pins are electrically coupled to the lower power rail. The integrated chip further comprises a third metal interconnect layer comprising an upper power rail overlying the lower power rail, and electrically coupled to the first set of connection pins and the second set of connection pins.

In yet other embodiments, the present disclosure relates a method of forming an integrated chip. The method comprises forming a first metal interconnect layer comprising a lower power rail extending in a first direction, and forming a second metal interconnect layer comprising a plurality of metal wires electrically coupled to the lower power rail and extending in a second direction. The method further comprises cutting a first set of the plurality of metal wires according to first cut mask to form a first set of connection pins straddling a first edge of the lower power rail, and cutting a second set of the plurality of metal wires according to second cut mask to form a second set of connection pins straddling a second edge of the lower power rail. The method further comprises forming a third metal interconnect layer having a upper power rail electrically coupled to the first set of connection pins and the second set of connection pins, wherein the upper power rail is parallel to and overlies the lower power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip, comprising:
   a first metal interconnect layer comprising a lower metal wire extending in a first direction;
   a second metal interconnect layer comprising a plurality of connection pins respectively coupled to the lower metal wire by way of a first via layer and extending over the lower metal wire in a second direction perpendicular to the first direction;
   a third metal interconnect layer comprising an upper metal wire extending over the lower metal wire and the plurality of connection pins in the first direction, wherein the upper metal wire is coupled to the plurality of connection pins by way of a second via layer arranged over the first via layer;
   wherein the plurality of connection pins comprise:
      a first set of connection pins arranged in the first direction at a first pitch, wherein the first set of connection pins respectively extend from a first end arranged completely over the lower metal wire to straddle a first edge of the lower metal wire; and
      a second set of connection pins arranged in the first direction at a second pitch with respect to the first set of connection pins that is less than the first pitch, wherein the second set of connection pins respectively extend from a second end arranged completely over the lower metal wire to straddle a second edge of the lower metal wire opposing the first edge.

2. The integrated chip of claim 1, further comprising:
a first active area comprising a plurality of source/drain regions arranged below the lower metal wire;
a second lower metal wire arranged on the first metal interconnect layer and extending in parallel to the lower metal wire, wherein the second lower metal wire is disposed over a second active area; and
wherein the first set of connection pins respectively comprise a first opposing end facing an opposite direction as the first end; and
wherein the first opposing end is arranged completely between the first active area and the second active area.

3. The integrated chip of claim 2, wherein the first set of connection pins straddling the lower metal wire is arranged with respect to a third set of connection pins straddling the second lower metal wire at a third pitch that is smaller than the second pitch.

4. The integrated chip of claim 3, further comprising:
a plurality of gate structures extending in the second direction over the first active area at a location below the first metal interconnect layer, wherein the plurality of gate structures are arranged at a gate pitch.

5. The integrated chip of claim 4, wherein the first pitch is equal to the gate pitch multiplied by a first even number, the second pitch is equal to the gate pitch multiplied by an odd number, and the third pitch is equal to the gate pitch multiplied by a second even number.

6. The integrated chip of claim 2, wherein the lower metal wire and the second lower metal wire are on different electrical nets.

7. The integrated chip of claim 1, wherein the first pitch is equal to a gate pitch multiplied by an even number and the second pitch is equal to the gate pitch multiplied by an odd number.

8. The integrated chip of claim 1, further comprising:
a plurality of gate structures extending in the second direction over an active area arranged within a substrate, wherein the first metal interconnect layer continuously extends over the plurality of gate structures and wherein the plurality of connection pins not arranged over the plurality of gate structures.

9. The integrated chip of claim 1, wherein the first end is arranged between the second edge of the lower metal wire the upper metal wire.

10. The integrated chip of claim 1, further comprising:
a plurality of gate structures extending in the second direction over a first active area and a second active area arranged within a substrate;
wherein the first set of connection pins respectively comprise a first opposing end facing an opposite direction as the first end; and
wherein the first end is arranged completely over the first active area and the first opposing end is arranged completely between the first active area and the second active area.

11. The integrated chip of claim 1,
wherein the first set of connection pins extend further past the first edge of the lower metal wire than past the second edge of the lower metal wire; and
wherein the second set of connection pins extend further past the second edge of the lower metal wire than past the first edge of the lower metal wire.

12. The integrated chip of claim 1, wherein the first end of each of the first set of connection pins are aligned along a first line extending in the first direction and the second end of each of the second set of connection pins are aligned along a second line extending in the first direction, wherein the first line is offset from the second line in the second direction by a non-zero distance.

13. The integrated chip of claim 1,
wherein the first end is coupled to a first opposing end by way of first edges that straddle the first edge of the lower metal wire; and
wherein the second end is coupled to a second opposing end by way of second edges that straddle the second edge of the lower metal wire.

14. An integrated chip, comprising:
a plurality of gate structures extending over an active area arranged within a semiconductor substrate;
a first metal interconnect layer comprising a lower power rail extending over the plurality of gate structures;
a second metal interconnect layer overlying the first metal interconnect layer and comprising:
a first set of connection pins straddling a first edge of the lower power rail and respectively having a first end arranged completely over the lower power rail;
a second set of connection pins straddling a second edge of the lower power rail and respectively having a second end arranged completely over the lower power rail, which is opposite the first edge, wherein first set of connection pins and the second set of connection pins are electrically coupled to the lower power rail and wherein the first set of connection pins are arranged at a first pitch, and the second set of connection pins are arranged with respect to the first set of connection pins at a second pitch that is less than the first pitch; and
a third metal interconnect layer comprising an upper power rail overlying the lower power rail, and electrically coupled to the first set of connection pins and the second set of connection pins.

15. The integrated chip of claim 14, wherein the first pitch is equal to a pitch of the plurality of gate structures multiplied by an even number and the second pitch is equal to the pitch of the plurality of gate structures multiplied by an odd number.

16. The integrated chip of claim 14, wherein edges of the first set of connection pins are not aligned with edges of the second set of connection pins.

17. The integrated chip of claim 14,
wherein the lower power rail extends in a first direction; and
wherein the first set of connection pins and the second set of connection pins extend in a second direction that is perpendicular to the first direction.

18. The integrated chip of claim 14, further comprising:
a second lower power rail extending in parallel to the lower power rail, wherein the lower power rail and the second lower power rail are on different electrical nets.

19. An integrated chip, comprising:
a lower conductive wire extending in a first direction;
a plurality of connection pins extending over the lower conductive wire in a second direction crossing the first direction, wherein the plurality of connection pins are respectively coupled to the lower conductive wire by way of a first via arranged below a respective one of the plurality of connection pins;
an upper conductive wire arranged over the lower conductive wire, wherein the plurality of connection pins are respectively coupled to the upper conductive wire by way of a second via arranged above a respective one of the plurality of connection pins; wherein the plurality of connection pins comprise:

a first set of connection pins respectively extending from a first end arranged completely over the lower conductive wire to straddle a first edge of the lower conductive wire; and a second set of connection pins respectively extending from a second end arranged completely over the lower conductive wire to straddle a second edge of the lower conductive wire that is opposite the first edge, wherein respective ones of the second set of connection pins are arranged between adjacent ones of the first set of connection pins along the first direction; and wherein the first set of connection pins are arranged at a first pitch, and the second set of connection pins are arranged with respect to the first set of connection pins at a second pitch that is less than the first pitch.

20. The integrated chip of claim 19, further comprising:
a plurality of gate structures extending in the second direction over an active area arranged within a substrate, wherein the lower conductive wire continuously extends over the plurality of gate structures and wherein the plurality of connection pins are not arranged over the plurality of gate structures.

* * * * *